(12) United States Patent  
Chen

(10) Patent No.: US 7,300,288 B1  
(45) Date of Patent: Nov. 27, 2007

(54) ELECTRICAL CONNECTOR

(75) Inventor: Ming-hao Chen, Guangzhou (CN)

(73) Assignee: Lotes Co., Ltd., Keelung (TW)

( * ) Notice: Subject to any disclaimer, the term of this patent is extended or adjusted under 35 U.S.C. 154(b) by 0 days.

(21) Appl. No.: 11/506,795

(22) Filed: Aug. 21, 2006

(51) Int. Cl.  
*H01R 12/00* (2006.01)

(52) U.S. Cl. ........................................ 439/66; 439/654

(58) Field of Classification Search ............... 439/66, 439/654  
See application file for complete search history.

(56) References Cited

U.S. PATENT DOCUMENTS

| | | | |
|---|---|---|---|
| 4,636,026 A * | 1/1987 | Cooney et al. | 439/482 |
| 7,025,602 B1 * | 4/2006 | Hwang | 439/66 |
| 2003/0190825 A1 * | 10/2003 | Sasaki | 439/66 |
| 2006/0073710 A1 * | 4/2006 | Hwang | 439/66 |

FOREIGN PATENT DOCUMENTS

CN        02293473.1        12/2003

* cited by examiner

*Primary Examiner*—James R. Harvey  
(74) *Attorney, Agent, or Firm*—Troxell Law Office, PLLC

(57) ABSTRACT

The present invention discloses an electrical connector, comprising an insulating body disposed with a plurality of receiving holes, each of which is disposed with a first terminal and a second terminal inter-penetrating each other, wherein the second terminal is a flat shape and the first and second terminals are inclinedly arranged in the terminal receiving hole; and an elastic body disposed between the first and second terminals. The second terminal of the electrical connector is a flat shape so that it may be manufactured by stamping, which is a simple manufacturing process; the first and second terminals are inclinedly arranged in the terminal receiving hole of the insulating body, which can enhance the arrangement density.

12 Claims, 4 Drawing Sheets

ELECTRICAL CONNECTOR

FIELD OF THE INVENTION

The present electrical connector relates to an electrical connector with pressing contacts.

BACKGROUND OF THE INVENTION

Conventional electrical connector with pressing contacts, the China Patent No 02293473 for example, comprises a metal shell, a probe, and a spring, wherein the spring is disposed between the metal shell and the probe. The probe has a spherical contact portion in order to render effective contacts between the probe and the external electronic devices inserted from any direction. This design can prevent the contact from being limited in certain directions, thereby enhancing the reliability of signal transmission. However, the sizes of the metal shell and the probe in the aforementioned invention are small, resulted in a high manufacturing cost. On the other hand, if the probe is a flat shape, its manufacture may be easier but the shape is unfavorable to the high arrangement density in the insulating body.

Consequently, it is necessary to design a new electrical connector to overcome the aforementioned drawbacks.

SUMMARY OF THE INVENTION

The object of the present invention is to provide an electrical connector which is easily manufactured, low cost, and conducive to densely arrangement.

To achieve the object described above, an electrical connector according to the present invention comprises an insulating body disposed with a plurality of receiving holes, each of which is disposed with a first terminal and a second terminal inter-penetrating each other, wherein the second terminal is a flat shape and the first and second terminals are inclinedly arranged in the terminal receiving hole; and an elastic body disposed between the first and second terminals.

Compared with the current technology, the second terminal of the electrical connector is a flat shape so that it may be manufactured by stamping, which is a simple manufacturing process; the first and second terminals are inclinedly arranged in the terminal receiving hole of the insulating body, which can enhance the arrangement density.

BRIEF DESCRIPTION OF THE DRAWINGS

The present invention can be more fully understood by reference to the following description and accompanying drawings, in which.

DETAILED DESCRIPTION OF THE INVENTION

Figure 1:
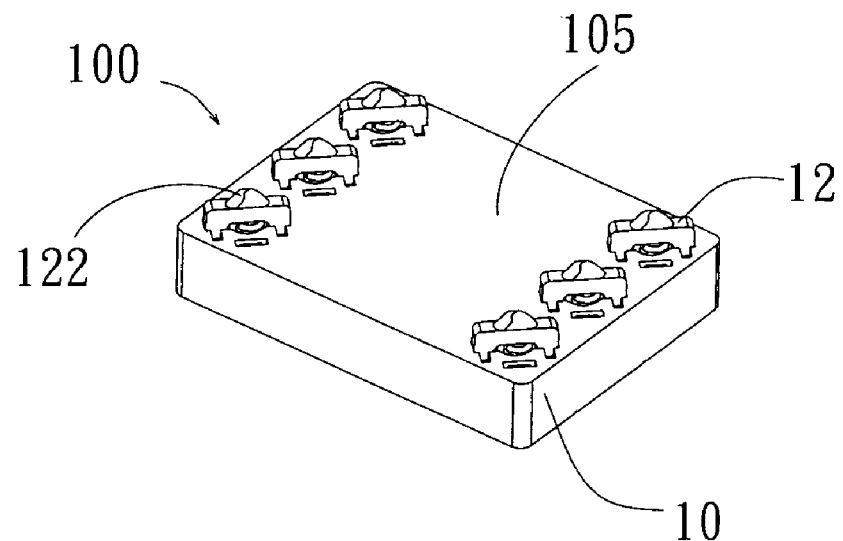
FIG. 1 schematically illustrates the perspective assembly view of the electrical connector according to the present invention.
Figure 2:
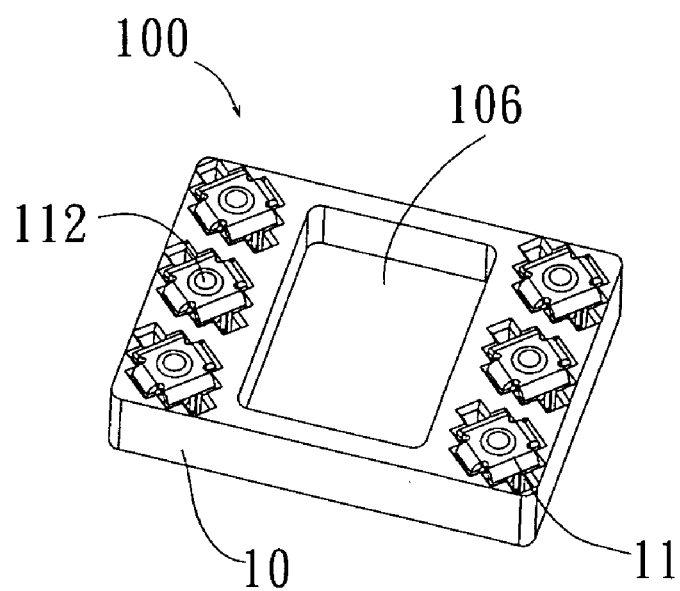
FIG. 2 schematically illustrates the perspective assembly view of the electrical connector from another view angle of FIG. 1.
Figure 3:
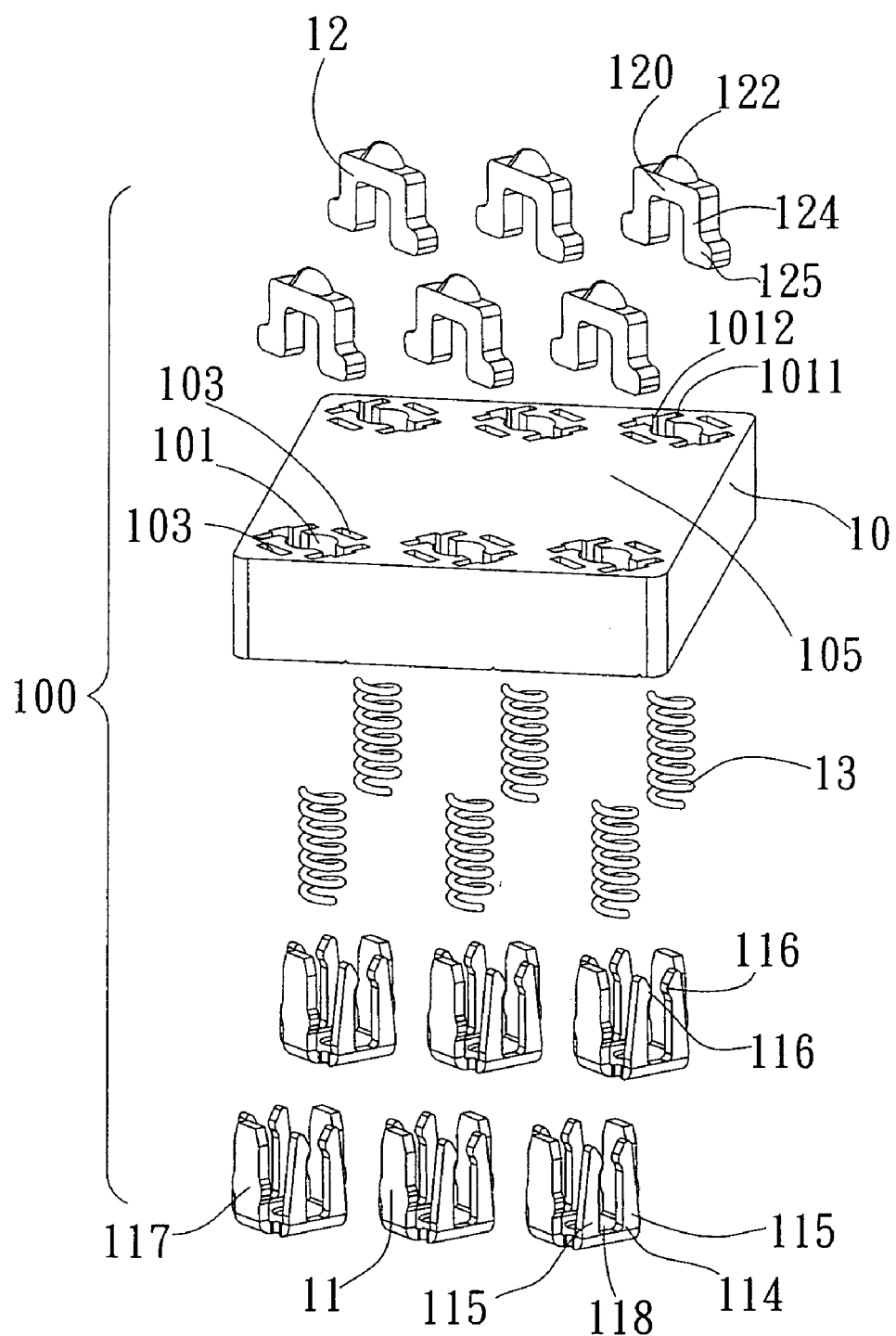
FIG. 3 schematically illustrates the perspective exploded view of the electrical connector of FIG. 1.
Figure 4:
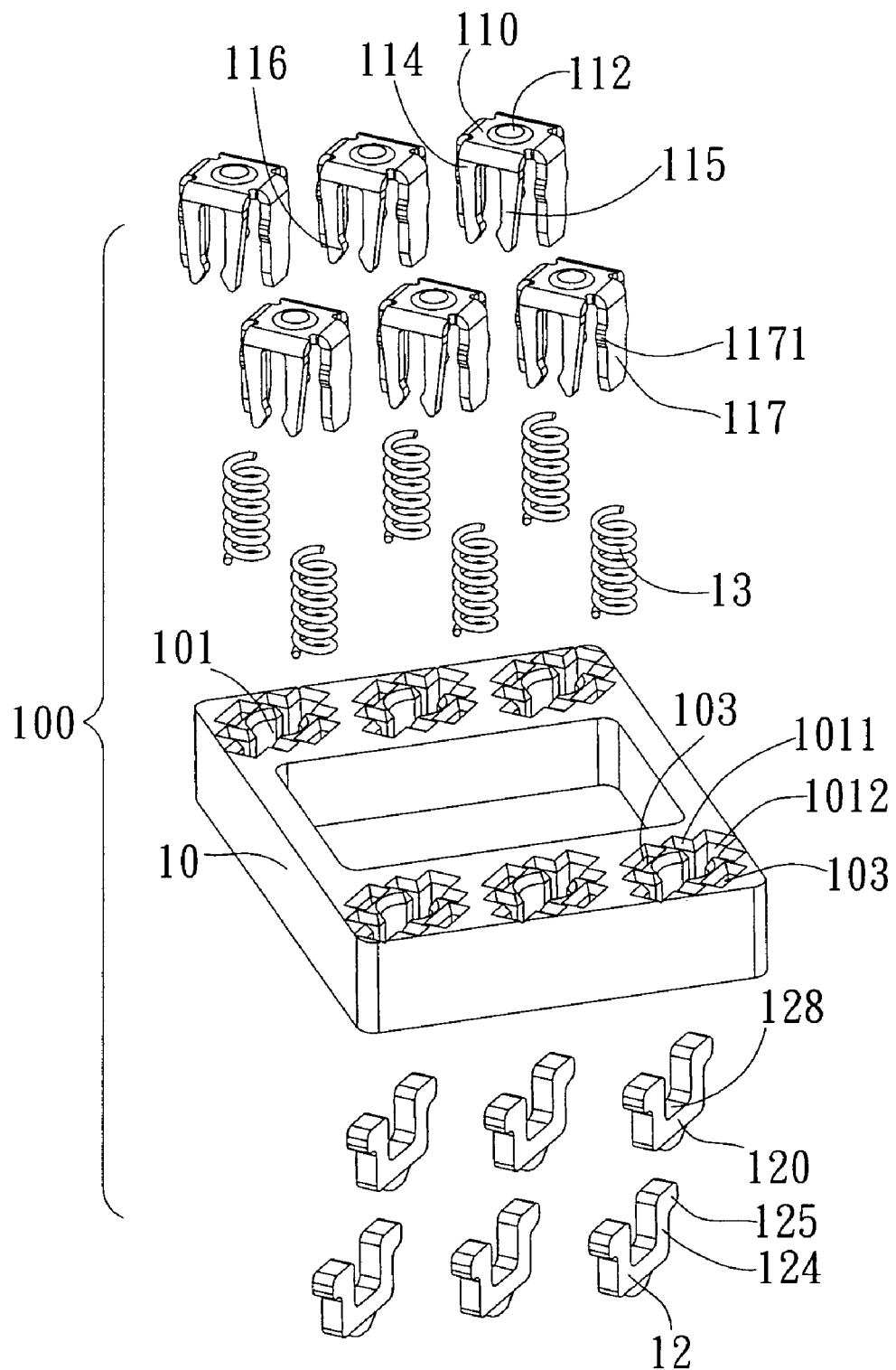
FIG. 4 schematically illustrates the perspective exploded view of the electrical connector from another view angle of FIG. 3.
Figure 5:
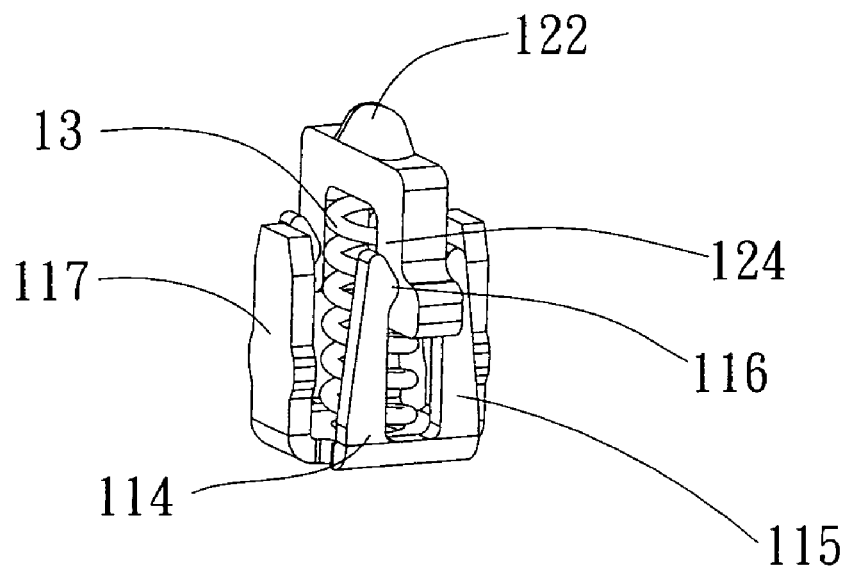
FIG. 5 schematically illustrates the perspective assembly view of the first terminal, the second terminal, and the spring of the electrical connector according to the present invention.
Figure 6:
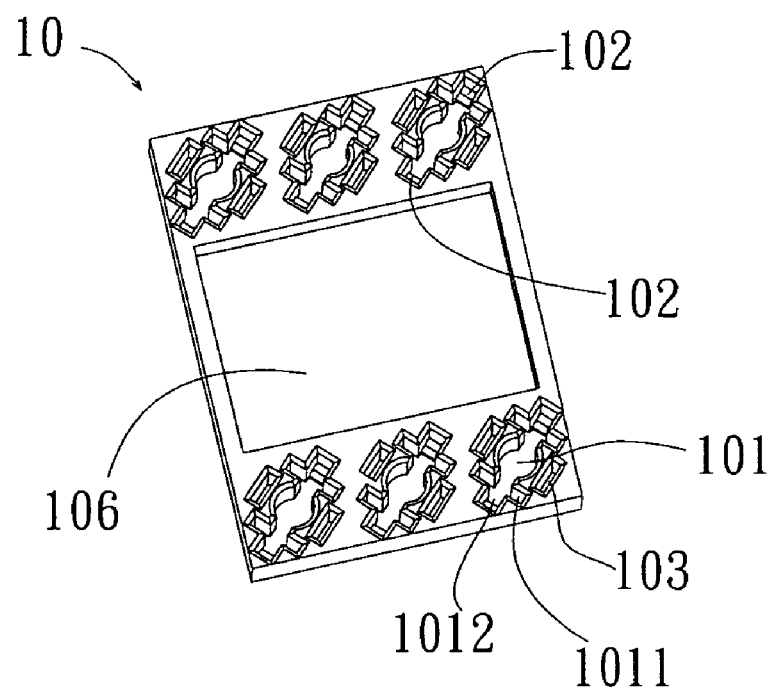
FIG. 6 schematically illustrates the insulating body of the electrical connector from another view angle of FIG. 2

Referring to FIGS. 1 to 6, an electrical connector 100 according to the present invention may be connected with external two electronic devices (not shown), comprising an insulating body 10, at least a first terminal 11, at least a second terminal 12, and an elastic body 13 disposed between the first terminal 11 and the second terminal 13 (in the present embodiment, the elastic body 13 is, for example but not limited to, a spring; of course, it may be other material with similar property, a polymer block (not shown), for example).

The insulating body 10 is inclinedly disposed with two rows of terminal receiving holes 101 penetrating from its upper to lower surfaces. The terminal receiving hole 101 comprises the first terminal receiving hole 1011 for receiving the first terminal 10 and the second terminal receiving hole 1012 which is perpendicular to and inter-penetrating with the first terminal receiving hole 1011. The first terminal receiving hole 1011 has a stop wall 102 on its two ends, respectively, and both sides close to the terminal receiving hole 101 are disposed with a fastening hole 103, respectively. A flat surface 105 is provided between the two rows of terminal receiving holes 101 on the insulating body 10, such that when the electrical connector 100 according to present invention is assembled with external electronic devices, a vacuum nozzle (not shown) may be attached onto the flat surface 105 to facilitate automatic installation and to enhance the installation rate. Furthermore, a square hole 106 is disposed between the two rows of terminal receiving hole 101 on the lower surface of the insulating body 10.

The first terminal 11 includes a square first body 110, and a contact portion 112 protrudingly and outward disposed on center of the first body 110, and a first pressing surface 118 disposed on the back of the first contact portion 112. Both sides of the first body 110 extend perpendicularly to form an elastic arm 114, respectively, and each elastic arm 114 comprises two separating arms 115 on whose end is protrudingly provided with a contact point 116, respectively. A fixed arm 117 is extendingly and perpendicularly disposed on two sides of the firs body 110 adjacent to the elastic arms 114, respectively. A protruding point 1171 is provided on both sides of the fixed arm 117, respectively, to render the fixed arm 117 more effectively retained in the insulating body 10.

The second terminal 12 is a flat shape, comprising a plate-shape second body 120 which comprise an upper surface and a lower surface. The upper surface of the second body 120 protrudingly extends to form a second contact portion 122 which has a shape of cone with an arc end. Two sides on the bottom of the second body 120 extend downward to form a connection portion 124, respectively. The exterior of the connection portion 124 extends outward to form a stop portion 125. A second pressing surface 128 is formed on the lower surface of the second body 120.

When the first terminal 11, the second terminal 12, and the spring 13 are assembled into the terminal receiving hole 101 of the insulating body 10, the first terminal 11 and the second terminal 12 are inclinedly arranged in the terminal receiving hole 101 of the insulating body 10. The two elastic arms 114 of the first terminal 11 are assembled into the two first terminal receiving holes 1011, respectively, and their fixed arms 117 are inserted into the fastening holes 103. The spring 13 is arranged in the center of the terminal receiving hole 101 and is pressing against the first pressing surface 118 and the second pressing surface 128. The second terminal 12 is assembled into the second terminal receiving hole 1012 and its stop portion 125 is snappingly engaged with the stop wall 102. In the mean time, the two elastic arms 114 of the first terminal 11 clamp the two connection portions 124 of the second terminal 12, respectively, and the contact point 116 presses against the two side surfaces of the connection portion 124, respectively. Since the thickness of the second terminal 12 is larger than the distance between the two contact points 116 of the same elastic arm 114, the effective connection between the first terminal 11 and the second terminal 12 can be ensured. When the second terminal 12 is applied with a force, the connection 124 may vertically slide between the two contact points 116. Furthermore, the first contact portion 112 and the second contact portion 122 protrude over the upper and lower surfaces of the insulating body 10 to connect with external electronic devices.

Since the second terminal 12 of the electrical connector is a flat shape so that it may be manufactured by stamping, which is a simple manufacturing process, and the first terminal 11 and the second terminal 12 are inclinedly arranged in the terminal receiving hole 1011 and the terminal receiving hole 1012 of the insulating body 10, which may enhance the arrangement density. Furthermore, because the second body 120 is protrudingly disposed with the second contact portion 122 which has a shape of cone with an arc end, external electronic devices may be inserted from any direction without affecting its contact with the second contact portion 122, such that the limitation of inserting direction is eliminated.

While the invention has been described with reference to the a preferred embodiment thereof, it is to be understood that modifications or variations may be easily made without departing from the spirit of this invention, which is defined by the appended claims.

What is claimed is:

1. An electrical connector, comprising:
    an insulating body disposed with a plurality of terminal receiving holes, in each of which is disposed a first terminal and a second terminal inter-penetrating each other, wherein the second terminal is a flat shape and the first and second terminals are arranged in the terminal receiving hole; and
    an elastic body disposed between the first and second terminals,
    wherein the first terminal comprises a first body, fixed arms extending perpendicularly from two opposite sides of the first body to be fixed in the insulating body, and elastic arms extending perpendicularly from another two opposite sides of the first body, respectively, the first terminal being configured to clamp the second terminal,
    wherein the elastic body is located between the two fixed arms and the two elastic arms.

2. The device according to claim 1, wherein the second terminal comprises a plate-shape second body and a second contact portion formed by extending protrudingly from the plate-shape second body.

3. The device according to claim 2, wherein the second contact portion has a shape of cone with an arc end.

4. The device according to claim 2, wherein the second terminal comprises an upper surface, a lower surface, and the second contact portion formed by extending from the upper surface of the second body.

5. The device according to claim 1, wherein the terminal receiving holes are arranged in the insulating body.

6. The device according to claim 1, wherein the second terminal comprises a plate-shape second contact portion, and a connection portion formed by extending from two sides of a bottom of the second body, respectively.

7. The device according to claim 1, wherein an end of the elastic arm is protrudingly disposed with a contact point, respectively, to abut and connect with the first terminal.

8. The device according to claim 1, wherein the second terminal comprises a plate-shape second body and a connection portion formed by extending from two sides of a bottom of the second body, respectively, and the elastic arm formed by extending perpendicularly from the two opposite sides of the first body configured to clamp the connection portion.

9. The device according to claim 1, wherein the fixed arm is disposed with a protruding point.

10. The device according to claim 1, wherein the first terminal further comprises a first contact portion formed by protruding outward from the center of the first body.

11. The device according to claim 1, the device further comprising a plurality of first terminals and a plurality of second terminals wherein a flat surface is provided on the insulating body between two adjacent first terminals, another flat surface being provided on the insulating body between two adjacent second terminals.

12. The device according to claim 1, wherein the elastic body is further located between the first terminal and the fixed arm.

* * * * *